(12) United States Patent
Moriyama et al.

(10) Patent No.: US 8,629,857 B2
(45) Date of Patent: Jan. 14, 2014

(54) ORGANIC ELECTRO-LUMINESCENT DISPLAY APPARATUS AND IMAGING APPARATUS INCLUDING THE SAME

(75) Inventors: Takashi Moriyama, Funabashi (JP); Toshihiko Mimura, Tokyo (JP); Nobuhiko Sato, Mobara (JP); Kohei Nagayama, Chiba (JP); Masami Iseki, Mobara (JP); Nozomu Izumi, Chiba (JP); Junya Tamaki, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 13/003,251

(22) PCT Filed: Jul. 9, 2009

(86) PCT No.: PCT/JP2009/062845
§ 371 (c)(1),
(2), (4) Date: Jan. 7, 2011

(87) PCT Pub. No.: WO2010/005108
PCT Pub. Date: Jan. 14, 2010

(65) Prior Publication Data
US 2011/0115961 A1    May 19, 2011

(30) Foreign Application Priority Data

Jul. 11, 2008  (JP) .................................. 2008-181503
Jun. 22, 2009  (JP) .................................. 2009-148012

(51) Int. Cl.
*G09G 3/30* (2006.01)

(52) U.S. Cl.
USPC ..................................... 345/176; 348/333.01

(58) Field of Classification Search
None
See application file for complete search history.

(56) References Cited

U.S. PATENT DOCUMENTS

| 6,861,710 | B2 * | 3/2005 | Murakami et al. | 257/359 |
| 8,269,412 | B2 * | 9/2012 | Oh et al. | 313/504 |
| 8,395,316 | B2 * | 3/2013 | Nagayama et al. | 313/506 |
| 2011/0121753 | A1 * | 5/2011 | Nagayama et al. | 315/294 |

FOREIGN PATENT DOCUMENTS

| JP | H05-101891 A | 4/1993 |
| JP | H09-199276 A | 7/1997 |
| JP | H11-329749 A | 11/1999 |
| JP | 2000-195664 A | 7/2000 |
| JP | 2004-119219 A | 4/2004 |
| JP | 2005-100928 A | 4/2005 |
| JP | 2005-174639 A | 6/2005 |
| JP | 2006-092998 A | 4/2006 |
| JP | 2006-114453 A | 4/2006 |
| JP | 2007-012359 A | 1/2007 |
| JP | 2007-134268 A | 5/2007 |
| WO | 2004/051614 A | 6/2004 |
| WO | 2004/068911 A | 8/2004 |
| WO | 2007/083918 A | 7/2007 |

* cited by examiner

*Primary Examiner* — Van Chow
(74) *Attorney, Agent, or Firm* — Canon U.S.A. Inc., IP Division

(57) ABSTRACT

Light is prevented from being emitted from a region that overlaps a contract hole in a structure in which light emitting devices are stacked. A stacked organic electro-luminescent display apparatus includes a contact hole that electrically connects a first electrode or a second electrode to a driving circuit. The first or second electrode and a second organic compound layer are provided in the contact hole, and the second organic compound layer existing in the contact hole does not emit light.

7 Claims, 5 Drawing Sheets

ORGANIC ELECTRO-LUMINESCENT DISPLAY APPARATUS AND IMAGING APPARATUS INCLUDING THE SAME

TECHNICAL FIELD

The present invention relates to an organic electro-luminescent display apparatus. More particularly, the present invention relates to an organic electro-luminescent display apparatus which includes a plurality of pixels each having an organic compound layer and in which the pixel includes a plurality of electro-luminescent devices stacked in the thickness direction thereof.

BACKGROUND ART

In recent years, a flat panel display using organic electro-luminescent devices (hereinafter, referred to as organic EL devices) has drawn attention. In particular, the organic EL device has advantages in that it has a low driving voltage and a high response speed and it is easy to increase the area thereof. Therefore, intensive research and development on a material and a device have been conducted.

Japanese Patent Application Laid-Open No. 2007-012359 discloses an organic electro-luminescent display apparatus including multi-color light emitting devices each having a plurality of top-emission organic EL devices stacked on each other. In addition, the organic electro-luminescent display apparatus includes active pixel circuits using thin film transistors (hereinafter, referred to as TFTs) provided on a substrate and an interlayer insulating film provided on the pixel circuit. One of a pair of electrodes of light emitting devices provided in the second and third layers is electrically connected to an output electrode of the TFT through contact holes formed in the first and second organic compound layers and the interlayer insulating film. The contact hole means a through hole that is formed by removing a portion of each layer of the display device and electrically connects the upper and lower layers.

In general, the organic EL device has a structure in which an organic compound layer with a thickness of 0.05 μm to 0.30 μm is interposed between electrodes. Therefore, light emitted from the light emitting layer is influenced by an optical interference effect between the electrodes.

In the display device disclosed in Japanese Patent Application Laid-Open No. 2007-012359, the wall of a contact hole formed in a first organic compound layer is inclined. A second organic compound layer is provided even in the contact hole. Therefore, the thickness of the second organic compound layer in the contact hole is different from that provided in a pixel region.

Therefore, since the second organic compound layer in the contact hole is also interposed between the electrodes, the second organic compound layer also emits light. That is, since the second organic compound layer has different thicknesses in the contact hole and in the pixel region, that is, the intensities of light emitted therefrom are different from each other due to an interference effect, the emission color varies.

In addition, the same problem as described above arises in the light emitting device provided in the third layer due to the contact hole provided in the second organic compound layer.

DISCLOSURE OF THE INVENTION

An object of the present invention is to provide a stacked organic electro-luminescent display apparatus which includes a contact hole and in which, even when a component of a second device is disposed in the contact hole, it does not emit light in the contact hole.

According to an aspect of the present invention, there is provided an organic electro-luminescent display apparatus which includes:
 a substrate having a driving circuit disposed thereon;
 a plurality of pixels which are disposed on the substrate and each of which includes a first electrode, a first organic compound layer, a second electrode, a second organic compound layer, and a third electrode sequentially provided on the substrate; and
 a contact hole for electrically connecting the first electrode or the second electrode to the driving circuit,
 wherein at least one of the first electrode and the second electrode and the second organic compound layer are provided in the contact hole in the mentioned order from the substrate side, and
 the second organic compound layer existing in the contact hole does not emit light.

Further features of the present invention will become apparent from the following description of exemplary embodiments with reference to the attached drawings.

BEST MODE FOR CARRYING OUT THE INVENTION

Figure 1:
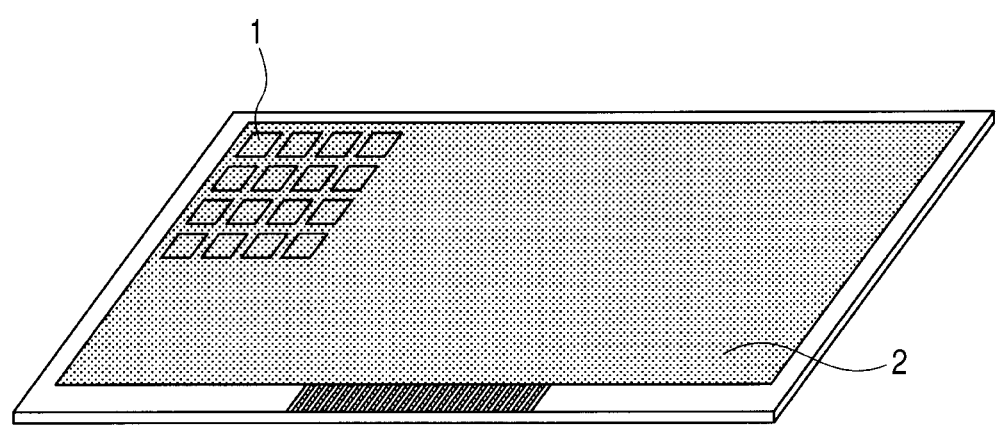
FIG. 1 is a perspective view illustrating one pixel of an organic electro-luminescent display apparatus according to a first embodiment of the present invention.

The organic electro-luminescent display apparatus according to the present invention includes a plurality of pixels arranged on the surface of a substrate. Each of the pixels includes first and second devices. The first and second devices are stacked on each other. That is, the second device is disposed on the first device. The device is an organic electro-luminescent device (organic EL device).

A driving transistor that drives the second device is connected to one electrode (second electrode) of the second device through a contact hole that is provided in a first organic compound layer constituting the first device.

Since a component of the second device is provided in the contact hole, the second device emits light in the contact hole when the structure is not changed. The contact hole is inclined or has a step difference, and the thickness of a second organic compound layer of the second device formed in the contact hole is different from the thickness of the second organic compound layer formed in a pixel region. Therefore, there is a difference in light intensity between the contact hole and the pixel region by an optical interference effect. As a result, when the second device emits light, the color purity is lowered.

In order to solve the above-mentioned problems, the present invention provides a structure that prevents the second device in the contact hole from emitting light, specifically, a structure that prevent the second organic compound layer of the second device in the contact hole from emitting light. As a result, even when a component of the second device is disposed in the contact hole in the thickness direction thereof, light having an emission color different from that emitted from the second device is not extracted from the organic electro-luminescent display apparatus.

As the structure that prevents the second organic compound layer of the second device from emitting light in the contact hole, any of the following structures may be used: a structure that provides an insulating layer between the second electrode and the second organic compound layer in the contact hole; a structure that modifies a portion of the second organic compound layer into an insulating portion; and a structure in which the second electrode is not provided in the contact hole.

Each pixel includes a plurality of devices, and the devices are driven such that they individually emit light or they do not emit light. The pixel includes at least first and second devices. The organic electro-luminescent device includes at least a pair of electrodes opposite to each other and an organic compound layer interposed between the electrodes as components.

The first device includes at least a first electrode, a first organic compound layer, and a second electrode. The second device includes at least the second electrode, a second organic compound layer, and a third electrode. In addition, the second device is disposed on the first device. Therefore, the second electrode is one of the pair of electrodes of the first device and is also one of the pair of electrodes of the second device.

The second electrode is transparent such that light emitted from one device is extracted to the outside through the other device. Therefore, the second electrode is referred to as a common transparent electrode in the present invention.

The first device, the second device, and the substrate are stacked in the order of the substrate, the first electrode, the first organic compound layer, the second electrode (common transparent electrode), the second organic compound layer, and the third electrode.

In the organic electro-luminescent display apparatus according to the present invention, light may be emitted from the substrate side, or light may be extracted from above the third electrode.

In the latter case, the third electrode is a transparent or translucent electrode that transmits light emitted from each device. The first electrode may be an electrode that reflects light emitted from the device as a reflective electrode or a stack of a reflective layer and a transparent electrode.

The substrate may be made of any material. For example, the substrate may be made of glass. The substrate may be a transparent member that transmits light emitted from the device or an opaque member that does not transmit light emitted from the device.

Driving transistors, serving as driving circuits, may be provided on the substrate. In this case, it is preferable to provide an insulating layer that insulates the driving transistor provided on the substrate from the first electrode of the first device. The driving transistor controls the device to emit light or not to emit light. Specifically, for example, a TFT may be used as the driving transistor.

The organic compound layer may have a single-layer structure or a multi-layer structure. When the organic compound layer has a multi-layer structure, it may include a light emitting layer (emission layer) and other layers. For example, other layers include a hole injection layer, a hole transport layer, an electron blocking layer, a hole blocking layer, and an electron transport layer. Other layers may be appropriately selected.

The light emitting layer may include only an organic compound layer made of a light emitting material. Alternatively, the light emitting layer may include at least a host material, which is a main component, and a guest material, which is a sub-component and provides the emission color of the device. It is preferable that the respective devices constituting the pixel emit different color light components.

In the organic electro-luminescent display apparatus according to the present invention, the pixel may further include third and fourth devices. The third device may be provided in the plane of the first device. The fourth device may be provided in the plane of the second device. In this case, the third device includes at least the first electrode, a third compound layer, and a fourth electrode.

The fourth device includes at least the fourth electrode, the second organic compound layer, and a third electrode. Therefore, the fourth electrode is one of a pair of electrodes of each of the third device and the fourth device. That is, the fourth electrode is a common transparent electrode.

Furthermore, the third organic compound layer has a different composition from the first organic compound layer. In addition, the organic compound layer of the fourth device and the organic compound layer of the second device are continuously formed and have the same composition. That is, the organic compound layers are the second organic compound layer.

According to the above-mentioned structure, the first device and the third device are arranged in the plane, and the second and fourth devices are disposed in the same plane on the plane having the first device and the third device are arranged thereon. The first device and the third device emit different color light components, and the second device and the fourth device emit the same color light component. The second device and the fourth device may be driven simultaneously or individually.

As a result, the first and third devices, and the second and fourth devices may emit different color light components. For example, the second and fourth devices may emit blue light, one of the first device and the third device may emit red light, and the other device may emit green light. In this case, the pixels including the devices can perform full color display.

The organic electro-luminescent display apparatus according to the present invention may be used as a flat panel display.

In addition, the organic electro-luminescent display apparatus according to the present invention may be used as a display unit of an imaging apparatus that includes at least an imaging unit and the display unit. For example, the imaging apparatus is a still camera or a digital camcorder. The imaging apparatus may be a digital camera or a film camera that records a captured image on a film.

Next, embodiments of the organic electro-luminescent display apparatus according to the present invention will be described. The following embodiments of the present invention are just illustrative, but the present invention is not limited thereto.

First Embodiment

FIG. 1 is a perspective view schematically illustrating an organic electro-luminescent display apparatus according to a first embodiment of the present invention. In FIG. 1, a plurality of pixels 1 are disposed in a matrix pattern in a display region 2.

Figure 2A:
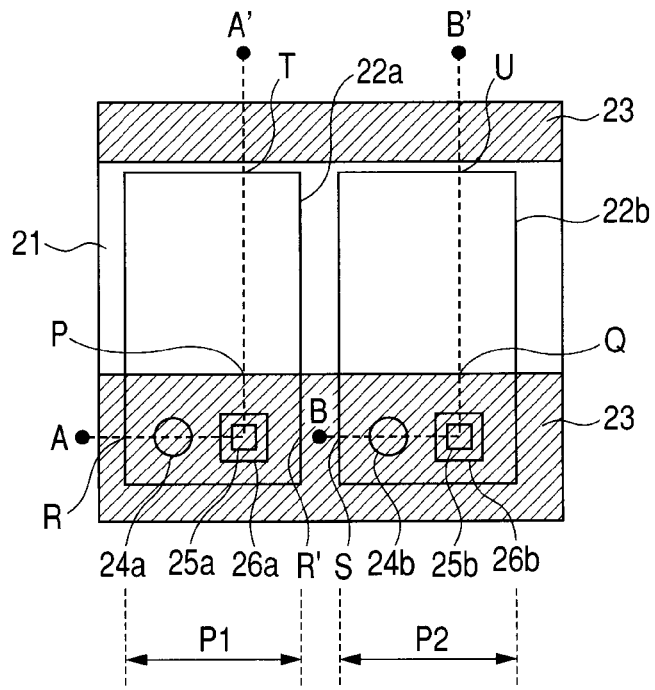
FIG. 2A is a plan view schematically illustrating one pixel of the organic electro-luminescent display apparatus according to the first embodiment.

FIG. 2A is a plan view schematically illustrating one pixel of the organic electro-luminescent display according to the present invention. Each of the pixels shown in FIG. 2A is disposed in a matrix pattern to form a display device. In this embodiment, one pixel includes four devices.

A bank 23 is provided on a first electrode 21 of each of a first device of a subpixel P1 and a third device of a subpixel P2. A second electrode 22a and a fourth electrode 22b are electrically connected to a driving circuit through contact holes 24a, 24b, 25a, 25b, 26a, and 26b.

The contact holes 24a and 24b are provided in a planarizing layer 30. A wiring line that connects a driving transistor to the second electrode 22a or the fourth electrode 22b is provided in each of the contact holes. Reference numerals 25a and 25b denote contact holes provided in the bank 23. The second electrode 22a and the fourth electrode 22b are provided in the corresponding contact holes. The contact holes 26a and 26b are respectively provided in a first organic compound layer 32 and a third organic compound layer 31. At least the second electrode 22a and the fourth electrode 22b are provided therein.

The subpixel P1 is a region in which the first electrode 21 is opposite to the second electrode 22a. The subpixel P2 is a region in which the first electrode 21 is opposite to the fourth electrode 22b. Therefore, the subpixel P1 is a rectangular region represented by the second electrode 22a in FIG. 2A, and the contact holes 24a, 25a, and 26a are provided in plane in the rectangular region. The subpixel P2 has the same structure as the subpixel P1.

Figure 2B:
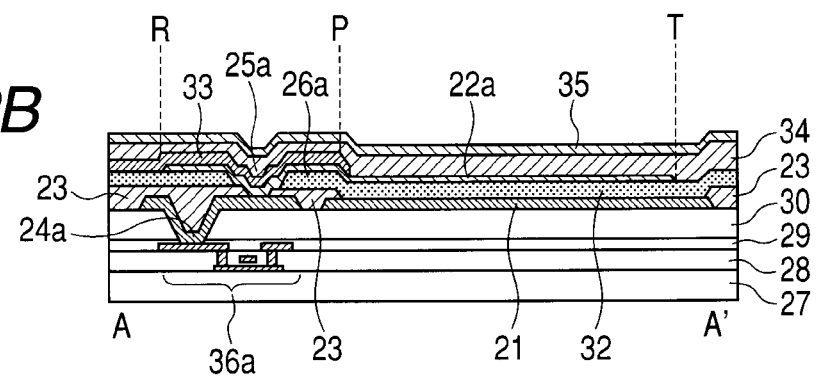
FIG. 2B is a cross-sectional view taken along the line A-A' of FIG. 2A.
Figure 2C:
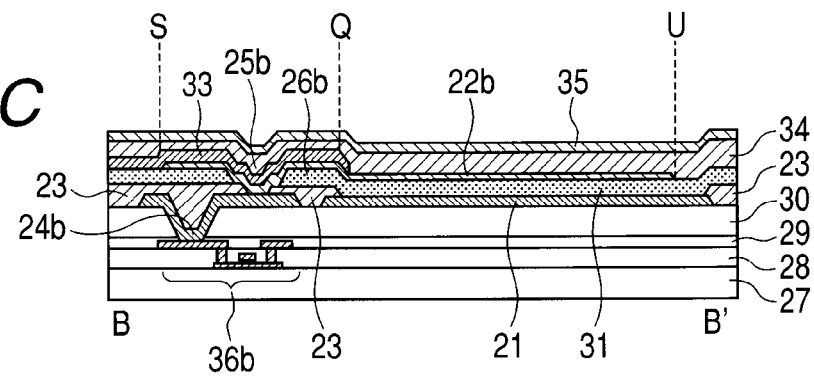
FIG. 2C is a cross-sectional view taken along the line B-B' of FIG. 2A.

FIGS. 2B and 2C are cross-sectional views taken along the lines A-A' and B-B' of FIG. 2A, respectively. In FIGS. 2B and 2C, reference numeral 21 denotes the first electrode, and reference numerals 22a and 22b denote the second electrode and the fourth electrode, respectively. In addition, reference numeral 23 denotes the bank, and reference numerals 24a, 24b, 25a, 25b, 26a, and 26b denote the contact holes. Furthermore, reference numeral 27 denotes an insulating substrate, which is a substrate, reference numeral 28 denotes a gate insulating layer, reference numeral 29 denotes an interlayer insulating layer, reference numeral 30 denotes the planarizing layer, reference numeral 31 denotes the third organic compound layer, and reference numeral 32 denotes the first organic compound layer. Furthermore, reference numeral 33 denotes an insulating layer, reference numeral 34 denotes a second organic compound layer, reference numeral 35 denotes a third electrode, and reference numerals 36a and 36b denote TFT pixel circuits.

The cross-sectional view shown in FIG. 2B taken along the line A-A' will be described in detail below. FIG. 2C has the same structure as FIG. 2B. For example, a Si, glass, or plastic substrate may be used as the substrate 27. The TFT driving circuit 36a, which is a driving circuit, is formed on the substrate by a known TFT forming technology.

The planarizing layer 30 is provided in order to prevent a light emission error, such as a short-circuit, from occurring in a light emitting device formed on an upper layer due to the unevenness of the TFT driving circuit.

The first electrode 21 is preferably formed by a vacuum evaporation process, a sputtering process, or an ion plating process, and the first electrode is preferably patterned by a photoresist technology.

Each subpixel is a top emission type, and the first electrode 21 may be made of a metal material, such as Cr, Al, Ag, or Pt, or alloys thereof so as to reflect light.

In this embodiment of the present invention, the first electrode 21 is made of a reflective material, but the present invention is not limited thereto. The first electrode may be formed by stacking a reflective thin film to the lower part of an electrode made of a transparent conductive material, such as ITO or IZO. The second electrode 22a and the fourth electrode 22b have light transmissivity. The third electrode 35 also has light transmissivity.

When the first electrode 21 is formed, a pixel electrode region and a region that is connected to the TFT driving circuit through the contact hole 24a are formed. This region corresponds to a region ranging from R to P in the figure. Furthermore, the subpixel P1 is a region ranging from R to R' in the drawings.

The bank 23 is formed on the first electrode 21 in order to define the pixel region and prevent the device from being short-circuited at the electrode edge. The bank 23 is formed in a region that covers the edge of the first electrode 21. The bank 23 may be made of any known material as long as the material has an insulating property. For example, the bank 23 may be made of an organic material, such as acrylic resin, epoxy resin, or polyimide resin, or an inorganic material, such as SiN or $SiO_2$.

The thickness of the bank 23 may be large enough to develop an insulating property. Specifically, it is preferable that the thickness of the bank be equal to or greater than about 0.01 μm and equal to or less than about several micrometers. The bank may be patterned by a photoresist technology. In addition, the contact hole 25a for electrically connecting the second electrode 22a to the TFT driving circuit 36a is provided in the bank 23.

As described above, the first organic compound layer 32 is formed on the substrate produced by the photoresist technology. The organic compound layer is preferably formed by, for example, a vacuum evaporation process, an ink jet process, or a printing process.

The organic compound layer includes at least a light emitting layer. The organic compound layer may have a stacked structure of a light emitting layer and other organic functional layers. Specifically, the organic compound layer may have a single-layer structure (only a light emitting layer), a two-layer structure (a light emitting layer/a hole injection layer), a three-layer structure (an electron transport layer/a light emitting layer/a hole transport layer), a four-layer structure (an electron injection layer/a light emitting layer/a hole transport layer/a hole injection layer), or a five-layer structure (an electron injection/an electron transport layer/a light emitting layer/a hole transport layer/a hole injection layer). However, the stacked structure is not limited thereto.

The light emitting layer may be made of any known material. Specifically, the light emitting layer is preferably made of a triarylamine derivative, a stilbene derivative, polyarylene, an aromatic fused ring compound, an aromatic heterocyclic compound, a heteroaromatic fused ring compound, a metal complex compound, a single oligomer thereof, or a composite oligomer thereof.

The light emitting layer may be made of a mixed material of a host material and a guest material. The guest material is selected to correspond to a desired emission color. The mixing ratio of the host material and the guest material may be appropriately selected depending on the combination of materials.

The hole transport layer may be generally made of a known compound having a good hole transport property. Specifically, the hole transport layer is preferably made of a material including an aromatic amine structure. The hole injection layer may be generally made of a known compound having a good hole injection property. Specifically, the hole injection layer is preferably made of, for example, a phthalocyanine compound or a triarylamine compound.

The electron transport layer may be generally made of a known compound having a good electron transport property. Specifically, the electron transport layer is preferably made of, for example, a material including a phenanthroline structure. The electron injection layer may be generally made of a known compound having a good electron transport property. Specifically, the electron injection layer is made of, for example, an alkali metal, an alkali earth metal, an alkali metal compound, or an alkali earth metal compound.

The contact hole 26a is provided in the first organic compound layer 32. The contact hole 26a is preferably formed by laser beam machining and can be formed by a known process used for a general thin film forming process, such as a YAG laser (including SHG and THG) or an excimer laser. It is possible to form contact holes at desired positions by radiating a laser beam with a width of several micrometers or emitting light from a surface-emitting light source to a contact hole portion through a mask to form a predetermined pattern on the first organic compound layer 32. It is preferable that the diameter of the contact hole be equal to or greater than 2 μm and equal to or less than 15 μm. The laser beam machining is preferably a laser abrasion process.

In the laser abrasion process, when the intensity of a laser beam radiated to a solid is more than a predetermined level (a threshold value), the surface of the solid is etched. When the intensity of a laser beam is more than a predetermined level (a threshold value), the laser beam is converted into electronic, thermal, photochemical, and mechanical energy in the surface of the solid. As a result, neutral atoms, molecules, positive ions, radicals, clusters, electrons, and light (photons) are explosively emitted so as to etch the surface of the solid.

The second electrode 22a is formed by patterning. The electrode is preferably made of a material having high transmittance. For example, the electrode is preferably made of a transparent conductive film, such as ITO, IZO, or ZnO, or an organic conductive film, such as polyacetylene. Alternatively, the electrode may be a translucent film that is made of a metal material, such as Ag or Al, with a thickness of equal to or greater than 10 nm and equal to or less than 30 nm. As the patterning process, any of the following processes may be used: a process of forming an electrode material film on the entire display region and performing the above-mentioned laser beam machining; and a process of using a shadow mask to selectively form the electrode.

In this stage, the second electrode 22a is connected to the TFT driving circuit 36a through the contact holes 24a, 25a, and 26a.

The insulating layer 33 is formed across a region in which the contact hole 25a, the contact hole 26a, the bank 23, and the second electrode 22a overlap each other. In FIGS. 2A to 2C, the edge of the bank 23 corresponds to positions P and Q. The insulating layer 33 is formed so as to extend to the positions P and Q, or it protrudes as viewed from a first device region. In FIG. 2B, the insulating layer 33 is formed on the second electrode 22a. However, the insulating layer 33 may be formed among the surface of the first electrode 21, the surface of the second electrode 22a, and the organic functional layer as long as it is interposed between two electrodes of the light emitting devices.

The insulating layer 33 may be made of any insulating material regardless of an organic material or an inorganic material as long as the insulating material has a volume resistivity of $1.0 \times 10^8$ Ω·cm or more. It is more preferable that the insulating layer be made of an insulating material having a volume resistivity of $1.0 \times 10^{12}$ Ω·cm or more. It is preferable that the insulating layer 33 has a sufficient thickness to ensure an insulating property. Specifically, the thickness of the insulating layer 33 is preferably equal to or greater than about 0.01 μm and equal to or less than several micrometers.

The insulating layer 33 is preferably formed by, for example, a spin coating process, a CVD process, a sputtering process, a printing process, or a vacuum evaporation process. In particular, a plasma polymer film formed by the CVD process or a sputtered film is excellent in a film thickness regulating property and a uniform thickness. The insulating layer 33 is preferably patterned by, for example, a laser beam machining technique or a process of using a shadow mask to selectively form a pattern.

The second organic compound layer 34 and the third electrode 35 formed in the entire display region 2 are sequentially disposed on the second electrode 22a and the insulating layer 33 in the contact holes 25a and 26a. The third electrode 35 is formed in the entire display region 2. Therefore, as described above, when the insulating layer 33 is not provided, the second organic compound layer 34 emits light in the contact hole. The first electrode 21, the second electrode 22a, and the third electrode 35 are connected to the driving circuit on the substrate.

Although not shown in FIGS. 2A to 2C, it is preferable that the organic electro-luminescent display apparatus according to the present invention have a sealing structure for isolating the devices from water or oxygen in the air.

In this embodiment, the first electrode 21 and the third electrode 25 are short-circuited to each other, and the first electrode 21 and the third electrode 25 have the same potential. The potentials of the second electrode 22a and the fourth electrode 22b vary, and a current flows to each organic compound layer. Therefore, the organic compound layer emits light.

Furthermore, in the present embodiment, in the subpixel P1, when the first organic compound layer 32 and the second organic compound layer 34 are considered as light emitting diodes, a current flows through the first organic compound layer 32 and the second organic compound layer in parallel to each other. That is, when a potential is applied to the second electrode 22a, the first electrode 21 and the third electrode 25 have the same potential. Therefore, voltages are applied to the first organic compound layer 32 and the second organic compound layer 34 in the opposite direction. As a result, while the first organic compound layer 32 emits light, the second organic compound layer 34 does not emit light.

Similarly, in the subpixel P2, voltages are applied to the second organic compound layer 34 and the third organic compound layer 31 in the opposite direction. Therefore, while the third organic compound layer 31 emits light, the second organic compound layer 34 does not emit light.

In the above-mentioned connection relationship, when the pixel shown in FIGS. 2A to 2C emits mixed color light, an AC voltage is applied among the first electrode 21, the second electrode 22a, the fourth electrode 22b, and the third electrode 35 to perform time-division AC driving. Specifically, a voltage is alternately applied to positive and negative electrodes at a frequency that cannot be perceived by the human, for example, at a frequency of about 60 Hz or more so as to control the emission luminance such that one pixel can emit arbitrary mixed color light.

In the present embodiment, as shown in FIGS. 2B and 2C, the insulating layer 33 is patterned between the second electrode 22a and the second organic compound layer 34 in the contact holes 25a and 26a. Therefore, no carrier is injected or transported to the second organic compound layer 34 disposed between a pair of electrodes of the second device (the resistance between the electrodes is high). As a result, a non-emission processing is performed on a region in which the contact holes 25a and 26a overlap each other (at the same position in the plane as shown in FIG. 2A). This is similarly applied to the subpixel P2.

The term "non-emission processing" herein employed means that light emission is not obtained in a state in which an effective voltage enabling a device to emit light is applied.

As a result, it is possible to suppress light emission from a region that overlaps the contact hole in the stacked light emitting devices, and it is possible to provide an organic electro-luminescent device with good color purity.

In addition, the non-emission processing is performed at a region that overlaps the bank 23. The same also applies to the subpixel P2. As a result, it is possible to suppress light emission passing through the bank and influenced by interference in the stacked light emitting devices, and it is possible to provide an organic electro-luminescent device with good color purity. In addition, since the light emitting devices are stacked to each other, it is possible to increase the aperture ratio of each subpixel.

Second Embodiment

Similar to the organic electro-luminescent display apparatus according to the first embodiment, an organic electro-luminescent display apparatus according to the present embodiment has a plurality of pixels disposed on the surface of a substrate. Each of the pixels includes two subpixels, and each of the subpixels includes two devices. The second embodiment differs from the first embodiment in that the first electrode and the third electrode are formed in each subpixel by patterning and the second electrode is continuously formed between subpixels adjacent to each other in the horizontal direction of a display region. Hereinafter, one subpixel of the pixel will be mainly described below, but the other subpixel has the same structure as the one subpixel.

Figure 3A:
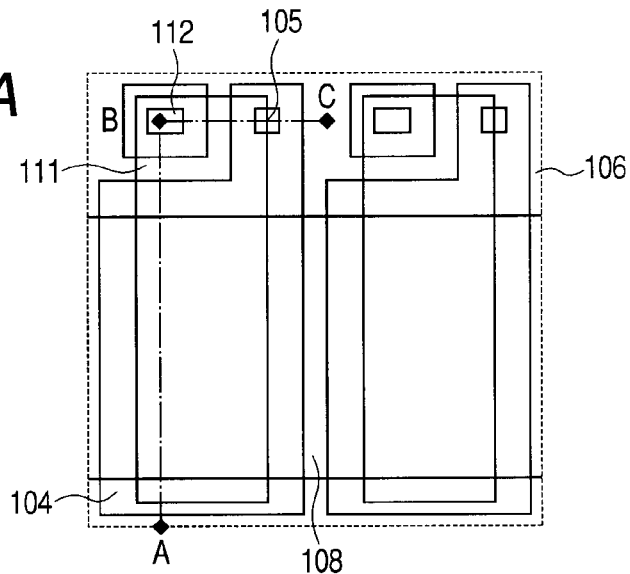
FIG. 3A is a plan view schematically illustrating one pixel of an organic electro-luminescent display apparatus according to a second embodiment of the present invention.
Figure 3B:
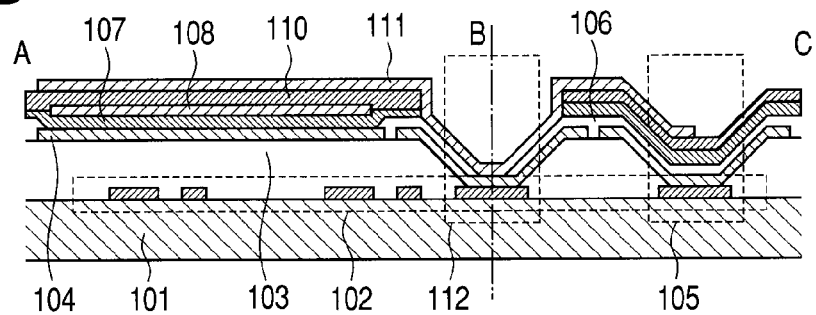
FIG. 3B is a cross-sectional view taken along the line A-B-C of FIG. 3A.
Figure 3C:
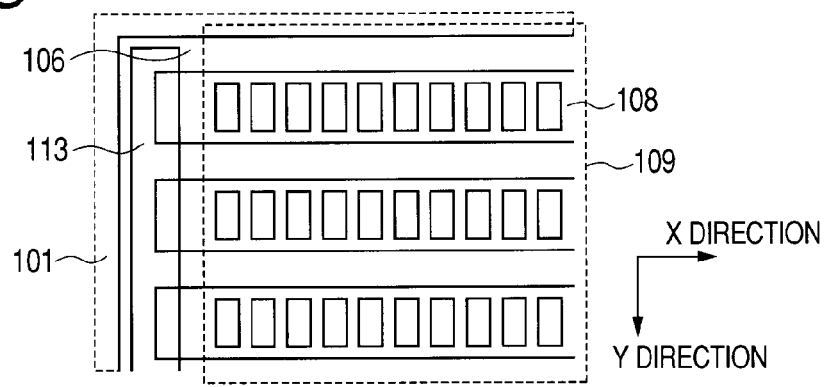
FIG. 3C is a plan view schematically illustrating a display region of the organic electro-luminescent display apparatus according to the second embodiment.

FIGS. 3A to 3C, 4A and 4B are diagrams illustrating the organic electro-luminescent display apparatus according to the present embodiment. FIG. 3A is a plan view illustrating one pixel of the organic electro-luminescent display apparatus according to the present embodiment. FIG. 3B is a cross-sectional view taken along the line A-B-C of FIG. 3A. FIG. 3C is a plan view illustrating the edge portion of the display region of the organic electro-luminescent display apparatus according to the present embodiment of the present invention.

As shown in FIG. 3B, in the organic electro-luminescent display apparatus according to the present embodiment, a driving circuit 102 is formed on a substrate 101. A planarizing layer 103 is formed on the driving circuit 102. A first electrode 104 is formed on the planarizing layer 103. The driving circuit 102 and the first electrode 104 are electrically connected to each other through a first contact hole 105 formed in the planarizing layer 103. A bank 106 is formed on the first electrode 104 in the first contact hole 105. The bank 106 is formed such that openings are provided in portions corresponding to the first electrode 104 and a second contact hole 112.

A first organic compound layer 107 is formed on the first electrode 104. A second electrode 108 is formed on the first organic compound layer 107. The second electrode 108 is formed in a region that avoids the first contact hole 105 and the second contact hole 112. As shown in FIG. 3C, the second electrode 108 is connected to a power supply line 113 outside a display region 109. A second organic compound layer 110 is formed on the second electrode 108. The second organic compound layer 110 is formed so as to extend over the first contact hole 105. A third electrode 111 is formed on the second organic compound layer 110. The third electrode 111 is connected to the driving circuit 102 through the second contact hole 112 formed in the planarizing layer 103 and the bank 106.

Figure 4A:
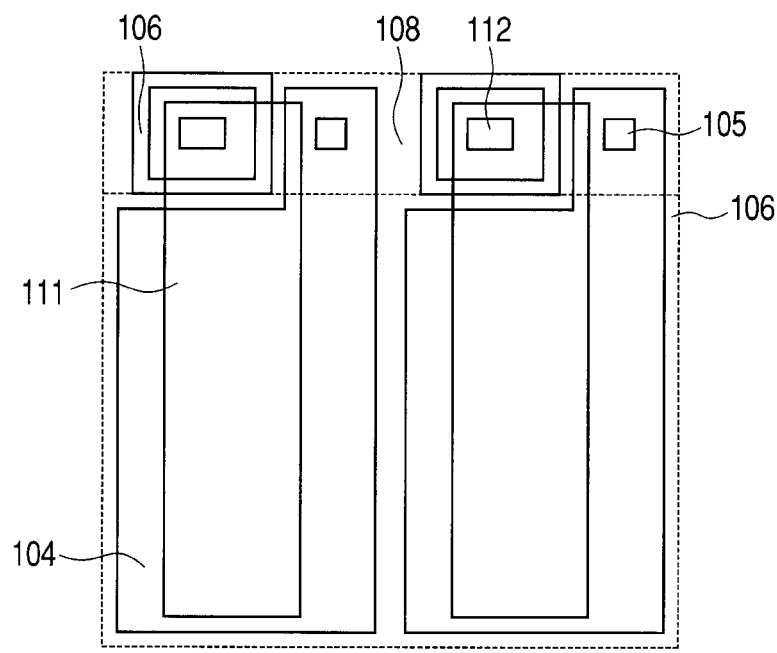
FIG. 4A is a plan view schematically illustrating one pixel of another organic electro-luminescent display apparatus according to the second embodiment.
Figure 4B:
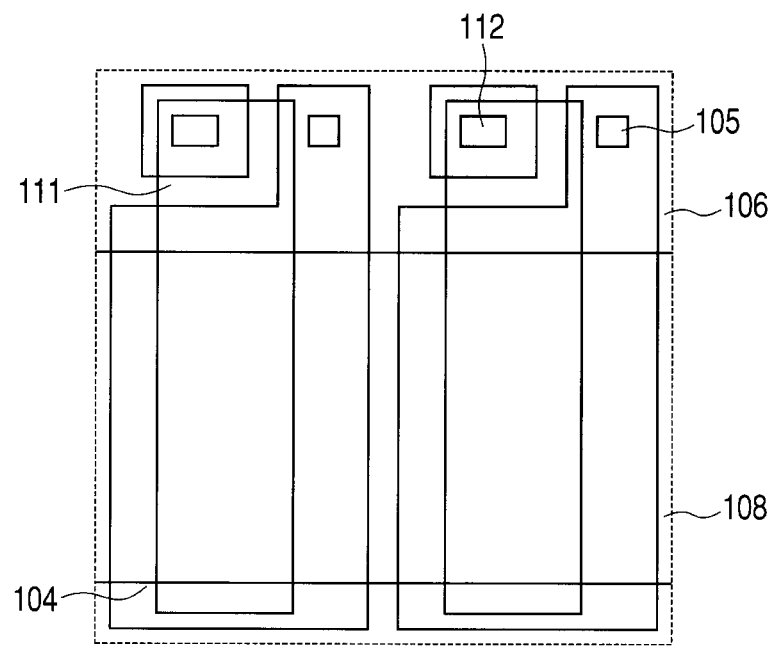
FIG. 4B is a plan view schematically illustrating the edge portion of a display region of another organic electro-luminescent display apparatus according to the second embodiment.

In the organic electro-luminescent display apparatus according to the present embodiment, at least one of the second electrode 108 and the third electrode 111 is formed in a region that does not overlap the first contact hole 105. For example, as shown in FIG. 3A, the second electrode 108 may be formed in a region that does not overlap the first contact hole 105. Alternatively, as shown in FIG. 4A, the third electrode 111 may be formed in a region that does not overlap the first contact hole 105. As shown in FIG. 4B, both the second electrode 108 and the third electrode 111 may be formed in a region that does not overlap the first contact hole 105. In the organic electro-luminescent display apparatus according to the present embodiment, the first organic compound layer 107 and the second organic compound layer 110 in the first contact hole 105 do not emit light in a step portion of the first contact hole 105. Therefore, the second organic compound layer 110 does not emit light in the step portion of the first contact hole 105. As a result, it is possible to obtain a display device with good color purity. As the organic compound layers formed on the first electrode 104 patterned for each subpixel, the first organic compound layer 107 and the third organic compound layer having different emission colors are periodically arranged for each subpixel. For example, the first organic compound layer 107 emitting blue light and the third organic compound layer (not shown) emitting green light are provided on the first electrode 104 in parallel with the substrate 101, and the first organic compound layer 107 and the third organic compound layer are periodically arranged for each subpixel. Therefore, the second electrode 108 provided on the first organic compound layer 107 extends to one side of the third organic compound layer opposite to the substrate, that is, on the third organic compound layer. In addition, the second organic compound layer 110 emitting red light is formed on the second electrode 108, and the third electrode 111 patterned for each subpixel is provided on the second organic compound layer. In this way, it is possible to perform full color display.

Next, a method of producing the organic electro-luminescent display apparatus according to the present embodiment will be described with reference to FIGS. 5A to 5E. FIGS. 5A to 5E are cross-sectional views illustrating the same region as that shown in the cross-sectional view of FIG. 3B.

Figure 5A:
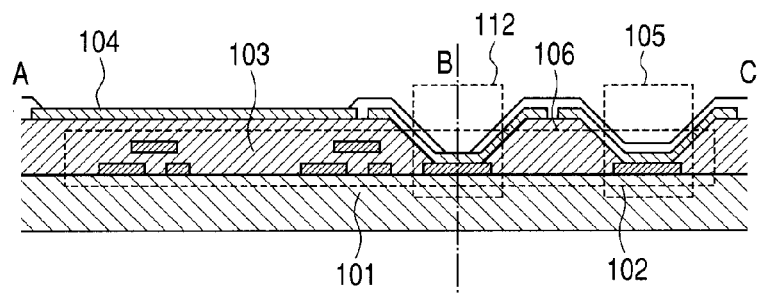
FIGS. 5A, 5B, 5C, 5D and 5E are diagrams illustrating a method of producing the organic electro-luminescent display apparatus according to the second embodiment.

First, as shown in FIG. 5A, the driving circuit 102 is formed on the substrate 101. A TFT circuit using, for example, p-Si or a-Si is formed as the driving circuit 102. The TFT circuit may be formed by a known process.

Then, the planarizing layer 103 is formed on the TFT circuit. The planarizing layer 103 may be an inorganic film, such as a SiN or SiO film, or a resin film, such as an acrylic resin film, an epoxy resin film, or a polyimide film, formed by, for example, a sputtering process, a CVD process, or a spin coating process. In particular, in an organic electro-luminescent display apparatus using a region on the TFT circuit as a light emitting region, which is represented by the top-emission organic electro-luminescent display apparatus, it is preferable that a resin film be used as at least a portion of the planarizing layer 103 in order to planarize the surface of the TFT circuit. In addition, in order to make the surface of the planarizing layer flat, it is preferable that the thickness of the resin film of the planarizing layer 103 be equal to or greater than 1 μm.

Then, the first contact hole 105 and the second contact hole 112 are formed in the planarizing layer 103. The first contact hole 105 and the second contact hole 112 can be formed by using, for example, a photolithography process.

Then, the first electrode 104 is formed on the planarizing layer 103. The first electrode 104 is obtained by forming a metal film, such as an Al or Ag film, or a transparent conductive film, such as an ITO or IZO film, using, for example, a sputtering process or a vacuum evaporation process and patterning the formed film using, for example, a photolithography process. The first electrode 104 is connected to the driving circuit 102 through the first contact hole 105.

Then, the bank 106 is formed covering the first contact hole 105 such that an opening is provided in the first electrode 104. The bank 106 may be formed of the same material as that forming the bank 23 according to the first embodiment by the same procedure as that in the first embodiment.

Figure 5B:
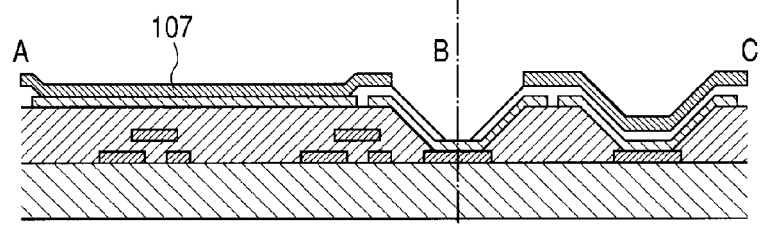

Then, as shown in FIG. 5B, the first organic compound layer 107 including at least a light emitting layer is formed on the first electrode 104. The first organic compound layer 107 may be made of the same material as that used in the first embodiment by, for example, a vacuum evaporation process or an ink jet process. The first organic compound layer 107 may include other functional layers, such as a hole injection layer, a hole transport layer, an electron transport layer, and an electron injection layer, in addition to the light emitting layer, if necessary. When the first organic compound layer 107 is formed by the vacuum evaporation process, it is possible to use a metal mask having an opening provided in a desired region to thereby define a region where the first organic compound layer 107 is formed.

The first organic compound layer 107 is not formed on the second contact hole 112 such that the second contact hole 112 is exposed. The second contact hole 112 may be exposed by, for example, a method of placing a metal mask on the second contact hole 112 during deposition or a method of forming the first organic compound layer 107 so as to cover the second contact hole 112 and removing the first organic compound layer 107 on the second contact hole 112 using, for example, a laser abrasion process.

Figure 5C:
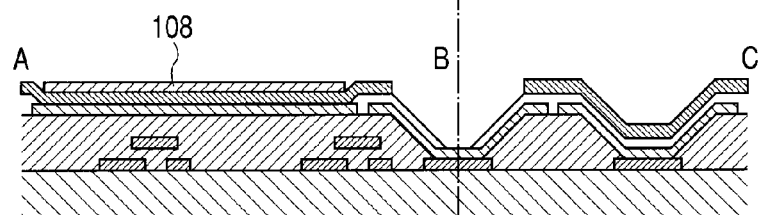

Then, as shown in FIG. 5C, the second electrode 108 is formed on the first organic compound layer 107. As the second electrode 108, a transparent conductive film, such as an ITO or IZO film, or a translucent metal thin film, such as an Al thin film or a Ag thin film, may be formed by, for example, a sputtering process or a vacuum evaporation process. The second electrode 108 is formed in a region that avoids at least the second contact hole 112. For example, the second electrode 108 is formed by positioning a metal mask having a strip-shaped opening provided therein such that the opening corresponds to a region in which the second contact hole 112 is not formed. In this way, it is possible to adopt the structure according to the present invention. In addition, the second electrode 108 may be patterned by forming a film on substantially the entire surface of the substrate 101 and removing an unnecessary region using, for example, a laser. Furthermore, as shown in FIG. 3C, the second electrode 108 is formed so as to be connected to a power supply line 113 outside the display region 109. In addition, as shown in FIG. 3C, the second electrodes 108 are formed such that each of the second electrodes is laid across the pixels adjacent to each other in the horizontal direction (X direction) of the display region 109 and the second electrodes are separated from each other between the pixels adjacent to each other in the vertical direction (y direction) of the display region. In addition, the second electrodes 108 are formed continuously so as to be laid across all the pixels arranged in the X direction. That is, the second electrodes 108 are strip-shaped electrodes that are provided in the display region 109 so as to avoid a region in which the first contact hole 105 and the second contact hole 112 are provided and be separated from each other in the Y direction of the display region 109.

Figure 5D:
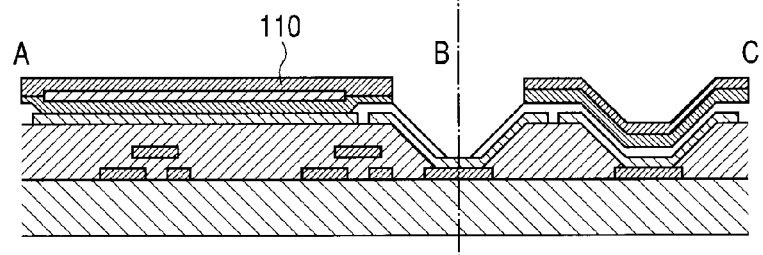

Then, as shown in FIG. 5D, the second organic compound layer 110 including at least a light emitting layer is formed on the second electrode 108. The second organic compound layer 110 may be made of the same material as that forming the first organic compound layer 107 by the same procedure as that of the first organic compound layer 107, and have the same layer structure as the first organic compound layer 107. When the second organic compound layer 110 is formed by a vacuum evaporation process, it is possible to use a metal mask having an opening provided in a desired region to thereby define a region in which the second organic compound layer 110 is formed. The second organic compound layer 110 is formed so as to cover the first contact hole 105.

The second organic compound layer 110 is not formed on the second contact hole 112 such that the second contact hole 112 is exposed. The second contact hole 112 may be exposed by, for example, a method of placing a metal mask on the second contact hole 112 when the second organic compound layer 110 is formed, or a method of forming the second organic compound layer 110 so as to cover the second contact hole 112 and removing the second organic compound layer 110 on the second contact hole 112 using, for example, a laser abrasion process.

In addition, the second contact hole 112 may be exposed by, for example, a method of forming the first organic compound layer 107 and the second organic compound layer 110 so as to cover the second contact hole 112 and then collectively removing the first organic compound layer 107 and the second organic compound layer 110 using, for example, a laser abrasion process.

Figure 5E:
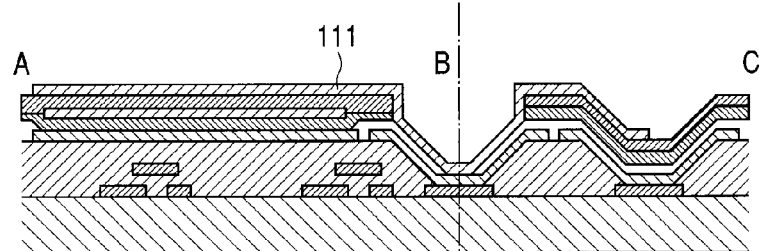

Then, as shown in FIG. 5E, the third electrode 111 is formed on the second organic compound layer 110. The third electrode 111 is obtained by forming a metal film, such as an Al or Ag film, or a transparent conductive film, such as an ITO or IZO film, using a sputtering process or a vacuum evaporation process, for example. The third electrode 111 is formed in a desired region by, for example, a method of forming a film using a metal mask having an opening provided in a desired region, or a method of forming a film on substantially the entire surface of the substrate 101 and patterning the film using, for example, a laser. It is preferable that one of the first electrode 104 and the third electrode 111 be a transparent or a translucent (semi-transmissive) electrode in order to transmit light.

A sealing means (not shown) for protecting the organic compound layer from, for example, water is provided. In this way, an organic electro-luminescent display apparatus is obtained.

In this embodiment, for example, the second electrode 108 is connected to the ground, and serves as a common electrode. When the first organic compound layer 107 and the second organic compound layer 110 are considered as light emitting diodes, the directions in which currents flow through the first organic compound layer 107 and the second organic compound layer 110 are opposite to each other. Therefore, when the TFT circuits individually apply a voltage to a plurality of first electrodes 104 and third electrodes 111, the first organic compound layer 107 and the second organic compound layer 110 can independently emit light. Two third electrodes 111 in the same pixel shown in FIG. 3A may be individually applied with a voltage, or they may be connected to one TFT circuit and driven at the same time.

Next, examples of the organic electro-luminescent display apparatus according to the present invention will be described. Examples 1 to 3 correspond to the organic electro-luminescent display apparatus according to the first embodiment, and Example 4 corresponds to the organic electro-luminescent display apparatus according to the second embodiment.

Example 1

A TFT driving circuit was formed on a glass substrate, serving as a substrate 27, by a low-temperature polysilicon forming technology. Then, the planarizing layer 30 made of an acrylic resin was formed in order to planarize the driving circuit. The thickness of the planarizing layer 30 was 2 μm. The contact holes 24a and 24b were formed in the planarizing layer 30 by a photolithography process. Then, as a reflective layer, an aluminum alloy (AlNiPd) layer was formed with a thickness of about 100 nm by a sputtering process and then patterned. In addition, as the first electrode 21, an IZO film was formed in a thickness of 80 nm by a sputtering process and then patterned. Then, the bank 23 was formed of an acrylic resin. The thickness of the bank 23 was 1.5 μm. The bank 23 was patterned by a photolithography process. At that time, the contact holes were also provided.

Then, the first organic compound layer 32 having a stacked structure of a hole transport layer/a red light emitting layer/an electron transport layer and the third organic compound layer 31 having a stacked structure of a hole transport layer/a green light emitting layer/an electron transport layer were formed by a vacuum evaporation process using a shadow mask.

Then, the contact holes were formed in the first and third organic compound layers by using a laser beam machining process.

Next, the second electrode 22a was made of Ag in a thickness of 15 nm by a vacuum evaporation process using a shadow mask such that it was transmissive.

Then, the insulating layer 33 was formed of $SiO_2$ in a thickness of 200 nm by an electron beam deposition process. A shadow mask was used to pattern the $SiO_2$ film in a region in which the bank and the second electrode 22a overlap each other.

Then, the second organic compound layer 34 having a stacked structure of a hole transport layer/a blue light emitting layer/an electron transport layer was formed, and the third electrode 35 was formed of Ag in a thickness of 15 nm by a vacuum evaporation process such that it was transmissive.

A driving means was used to drive the display device such that the display device emitted blue light only. As a result, the color of light emitted from the display region was the same as that of light emitted from each pixel, and a display device with good color purity was obtained which suppressed the influence by light emission from regions in which the blue light emitting device overlapped the contact hole and the bank.

Example 2

A display device was produced by following the same procedure as in Example 1 except for the method of forming the insulating layer 33. As the insulating film 33, a fluorocarbon film was formed in a thickness of 200 nm by a plasma CVD process. $CF_4$ was used as a process gas. A process gas of a high purity was introduced into a deposition chamber and plasma was generated at a low gas pressure to generate a deposition seed. Then, the deposition was performed on the surface of a sample.

The fluorocarbon film was patterned in a region in which the bank 23 and the second electrode 22a overlapped each other by a laser beam machining process.

A driving means was used to drive the display device such that the display device emitted blue light only. As a result, the color of light emitted from the display region was the same as that of light emitted from each pixel, and a display device with good color purity was obtained which suppressed the influence by light emission from regions in which the blue light emitting device overlapped the contact hole and the bank 23.

Example 3

A display device was produced by following the same procedure as in Example 1 except for the method of forming the insulating layer 33. As the insulating film 33, a SiN film was formed in a thickness of 200 nm by a reactive sputtering process. The SiN film was patterned in a region in which the bank 23 and the second electrode 22a overlapped each other by a laser beam machining process.

A driving means was used to drive the display device such that the display device emitted blue light only. As a result, the color of light emitted from the display region was the same as that of light emitted from each pixel, and a display device with good color purity was obtained which suppressed the influence by light emission from regions in which the blue light emitting device overlapped the contact hole and the bank 23.

Example 4

Next, Example 4 will be described with reference to FIGS. 5A to 5E. In an organic electro-luminescent display apparatus according to Example 4, first, as shown in FIG. 5A, a TFT driving circuit is formed as a driving circuit 102 on a glass substrate serving as a substrate 101, by a low-temperature polysilicon forming process. Then, an epoxy resin is coated on the TFT circuit by a spin coating process and the coated film is patterned by a photolithography process, thereby forming a planarizing layer 103. The thickness of the planarizing layer 130 is 2 μm. A first contact hole 105 and a second contact hole 112 are formed in the planarizing layer 130 during patterning.

A first electrode 104 having a two-layer structure of an Al film with a thickness of 200 nm and an IZO film with a thickness of 30 nm is formed on the planarizing layer 103 by a sputtering process, and then patterned by the photolithography process. The first electrode 104 is formed so as to be electrically connected to the TFT circuit through the first contact hole 105.

Then, an epoxy resin is applied by a spin coating process, and the coated film is patterned by the photolithography process, thereby forming the bank 106. The bank 106 is patterned such that it covers the first contact hole 105 and the periphery of the first electrode 104 and a portion of the first electrode 104 and a portion of the second contact hole 112 are exposed. The thickness of the bank 106 is 0.5 μm.

Then, as shown in FIG. 5B, the first organic compound layer 107 is formed on the opening of the first electrode 104. In the first organic compound layer 107, first, a hole transport layer made of α-NPD is formed with a thickness of 50 nm on substantially the entire display region 109 of the substrate 101 by a vacuum evaporation process. Then, as a blue light emitting layer, a film of Balq doped with perylene is formed in a thickness of 30 nm on the first electrode 104 corresponding to alternate subpixel of a plurality of first electrodes 104 by a vacuum evaporation process. A metal mask is used to define a region in which the blue light emitting layer is formed. Then, as a green light emitting layer, a film of Balq doped with coumarine 6 is formed in a thickness of 30 nm on the first electrode 104 corresponding to the other alternate subpixel by the vacuum evaporation process. A metal mask is used to define a region in which the green light emitting layer is formed. Then, an electron transport layer made of bathophenanthroline (hereinafter, referred to as Bphen) is formed in a thickness of 10 nm on the blue light emitting layer and the green light emitting layer in substantially the entire display region 109 by a vacuum evaporation process. Then, an electron injection layer made of Bphen doped with 0.3 wt % of $Cs_2CO_3$ is formed in a thickness of 20 nm in substantially the entire display region 109 of the substrate 101 by a vacuum evaporation process. In this way, the first organic compound layer 107 emitting blue light and the third organic compound layer emitting green light are formed in parallel with the substrate 101.

Then, as shown in FIG. 5C, the second electrode 108 made of Ag is formed in a thickness of 15 nm on the first organic compound layer 107 and the third organic compound layer. The second electrode 108 is formed in a strip shape in a region that does not overlap the first contact hole 105 and the second contact hole 112 by a vacuum evaporation process, using a metal mask having a strip-shaped opening formed therein. As shown in FIG. 3C, the second electrode 108 is electrically connected to the TFT circuit outside the display region 109.

Next, as shown in FIG. 5D, the second organic compound layer 110 is formed on the second electrode 108. As the second organic compound layer 110, first, an electron injection layer made of Bphen doped with 0.3 wt % of $Cs_2CO_3$ is formed in a thickness of 20 nm in substantially the entire display region 109 of the substrate 101 by a vacuum evaporation process. Then, an electron transport layer made of Bphen is formed in a thickness of 10 nm in substantially the entire display region 109 of the substrate 101 by a vacuum evaporation process. Then, a red light emitting layer made of rubrene doped with DCM is formed in a thickness of 30 nm in substantially the entire display region 109 by a vacuum evaporation process. Then, a hole transport layer made of α-NPD is formed in a thickness of 10 nm in substantially the entire display region 109 by a vacuum evaporation process. Furthermore, a hole injection layer made of α-NPD doped with 3 wt % of $MoO_3$ is formed in a thickness of 30 nm in substantially the entire display region 109 by a vacuum evaporation process. In this way, the second organic compound layer 110 is formed so as to cover the first contact hole 105 and the second contact hole 112.

Next, the first organic compound layer 107 and the second organic compound layer 110 on the second contact hole 112 are removed. The first organic compound layer 107 and the second organic compound layer 110 on the second contact hole 112 are removed by a pulsed laser. As the pulsed laser, a Nd:YAG laser having a wavelength of 355 nm and a pulse width of 6 ns is used. A pulsed laser beam is radiated to abrade the first organic compound layer 107 and the second organic compound layer 110. Therefore, the first organic compound layer 107 and the second organic compound layer 110 are removed from the second contact hole 112.

Then, as shown in FIG. 5E, the third electrode 111 made of Ag is formed in a thickness of 15 nm on the second organic compound layer 110. The third electrode 111 is formed by a vacuum evaporation process using a metal mask. The third electrode 111 is electrically connected to the TFT circuit through the second contact hole 112. A sealing means (not shown) is provided, whereby an organic electro-luminescent display apparatus can be obtained.

In the organic electro-luminescent display apparatus produced by the above-mentioned method, even when an organic compound layer is arranged in a step portion of the first contact hole 105 having a large step difference, the organic compound layer does not emit light. Therefore, a display device with good color purity can be obtained. In addition, the second electrode 108, which is a common electrode, is connected to the TFT circuit outside the display region 109. Therefore, it is not necessary to form a contact hole for connection between the second electrode 108 and the TFT circuit in the display region 109, and thus it is possible to improve the aperture ratio. As a result, when a small and high-precision organic electro-luminescent display apparatus is produced, the effect becomes further remarkable. In addition, when the second electrode 108 is formed in a strip shape, the second electrode 108 can easily be formed though a deposition process using a metal mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-181503, filed Jul. 11, 2008, No. 2009-148012, filed Jun. 22, 2009, which are hereby incorporated by reference herein in their entirety.

The invention claimed is:

1. An organic electro-luminescent display apparatus comprising:
   a substrate having a driving circuit disposed thereon;
   a plurality of pixels which are disposed on the substrate and each of which comprises a first electrode, a first organic compound layer, a second electrode, a second organic compound layer, and a third electrode sequentially provided on the substrate; and
   a contact hole for electrically connecting the first electrode or the second electrode to the driving circuit,
   wherein the second organic compound layer and at least one of the first electrode and the second electrode are provided in the contact hole, and
   the second organic compound layer existing in the contact hole does not emit light.

2. The organic electro-luminescent display apparatus according to claim 1,
   wherein the first electrode and the second organic compound layer are provided in the contact hole, and
   at least one of the second electrode and the third electrode is not provided in the contact hole.

3. The organic electro-luminescent display apparatus according to claim 1,
   wherein the pixel comprises the first organic compound layer and a third organic compound layer disposed in parallel to the substrate, and
   the second electrode and the second organic compound layer are disposed on the third organic compound layer.

4. The organic electro-luminescent display apparatus according to claim 1, further comprising:
   a display region having the plurality of pixels disposed therein, wherein the second electrode is laid across the pixels adjacent to each other in a horizontal direction of the display region, and the second electrodes are separated from each other between the pixels adjacent to each other in a vertical direction of the display region.

5. The organic electro-luminescent display apparatus according to claim 4, wherein the second electrodes extend so as to be laid across all the pixels arranged in the horizontal direction of the display region.

6. The organic electro-luminescent display apparatus according to claim 1, further comprising:

an insulating layer that is provided between the second organic compound layer existing in the contact hole and the second electrode electrically connected to the driving circuit in the contact hole.

7. An imaging apparatus comprising:

an imaging unit; and the organic electro-luminescent display apparatus set forth in claim 1 as a display unit.

* * * * *